United States Patent [19]
Franklin et al.

[11] Patent Number: 6,034,725
[45] Date of Patent: Mar. 7, 2000

[54] SEMICONDUCTOR IMAGE SENSOR WITH AN INSULATING BARRIER LAYER

[75] Inventors: Anthony R. Franklin, East Grinstead; Carl Glasse, Redhill; Martin J. Powell, Horley, all of United Kingdom

[73] Assignee: U.S. Philips Corporation, New York, N.Y.

[21] Appl. No.: 08/731,623

[22] Filed: Oct. 15, 1996

[30] Foreign Application Priority Data

Oct. 13, 1995 [GB] United Kingdom ............... 9520791

[51] Int. Cl.[7] .............................. H04N 5/335; H04N 9/64
[52] U.S. Cl. .................. 348/310; 348/307; 348/243; 250/208.1; 257/292
[58] Field of Search .................. 250/208.1; 257/290, 257/291, 292, 350; 361/792; 174/255, 256, 257, 250; 348/302–310, 241, 243, 250; H04N 5/335, 3/14, 9/64

[56] References Cited

U.S. PATENT DOCUMENTS

| | | | |
|---|---|---|---|
| 4,608,749 | 9/1986 | Harada et al. | 29/572 |
| 4,740,824 | 4/1988 | Yano et al. | 357/30 |
| 5,204,519 | 4/1993 | Nishihara et al. | 250/208.1 |
| 5,233,181 | 8/1993 | Kwansnick et al. | 250/208.1 |
| 5,396,072 | 3/1995 | Schielbel et al. | 250/370.09 |
| 5,516,712 | 5/1996 | Wei et al. | 437/40 |
| 5,619,033 | 4/1997 | Weisfield | 250/208.1 |
| 5,818,053 | 10/1998 | Tran | 250/370.09 |
| 5,859,463 | 1/1999 | Liu et al. | 257/448 |

FOREIGN PATENT DOCUMENTS

| | | | |
|---|---|---|---|
| 4317372 | 11/1992 | Japan | H01L 27/146 |
| 4317373 | 11/1992 | Japan | H01L 27/146 |

*Primary Examiner*—Tuan Ho
*Assistant Examiner*—Ngoc-Yen Vu
*Attorney, Agent, or Firm*—Dwight H. Renfrew

[57] ABSTRACT

An image sensor comprises switching elements 30 on a substrate 1. An insulating separation layer 9 is disposed over the switching elements so that a photodiode arrangement 20a disposed over the insulating separation layer 9, can overlap the switching elements 30 and occupy a maximum area of the image sensor. A barrier layer 10 is interposed between the insulating separation layer 9 and the photodiode arrangement 20a, which prevents degradation of the photodiode characteristics over time.

19 Claims, 4 Drawing Sheets

SEMICONDUCTOR IMAGE SENSOR WITH AN INSULATING BARRIER LAYER

BACKGROUND OF THE INVENTION

1. Field of the Invention

This invention relates to an image sensor for detecting radiation.

2. Description of the Related Art

Image sensors have previously been proposed which comprise a substrate carrying a plurality of switching elements, and a photosensitive element which is associated with each switching element. When appropriate radiation is incident on the photosensitive element, charge is developed which may be stored by the self-capacitance of the photosensitive element, or by an additional charge storage means.

It is desirable to maximise the proportion of the area of the sensor which is occupied by the photosensitive elements, so as to increase the efficiency of the device.

JP-A-04-317373 discloses an image sensor device in which thin film transistors are formed on a substrate, and an insulating film is formed over the transistors. Photoelectric conversion devices are formed over the insulating film, and this enables overlap of the photoelectric conversion devices over the switching transistors. As a result, the proportion of the area of the sensor which is occupied by the photoelectric devices can be maximised.

JP-A-04-317373 is particularly concerned with a mechanically scanning image sensor, in which the minimisation of the size of the sensor is desirable. JP-A-04-317373 is also directed specifically to the production of the insulating film with a flat upper surface, so that the light receiving surface of the image sensor is uniform, and consequently can be maintained at a constant distance from the image to be sensed.

A problem with image sensors of the prior art is that the characteristics of the photoelectric devices degrade over time, notably the dark current in the photoelectric devices.

SUMMARY OF THE INVENTION

The present invention is based on the realisation that the degradation of the photoelectric device characteristics may be the result of the penetration of polymer molecules from the insulating separation layer into the structure of the diode.

According to the present invention, there is provided:

an image detector comprising a substrate carrying a plurality of switching elements and an insulating separation layer disposed over the substrate and substantially covering the switching elements, a photosensitive element being associated with each switching element, each photosensitive element comprising first and second electrodes, the first electrode of each photosensitive element being coupled to a first electrode of the associated switching element, in which an insulating barrier layer is disposed over the insulating separation layer, and the photosensitive elements are disposed over the insulating barrier layer.

The detector structure according to the invention provides an insulating barrier layer between the insulating separation layer and the photosensitive elements. This barrier layer prevents contamination of the photosensitive element from the insulating layer, which contamination has been found to be responsible for the degradation of the photosensitive element characteristics, particularly the dark current. The barrier layer preferably comprises silicon nitride.

Preferably, the first electrode of the photosensitive element is coupled to the first electrode of the associated switching element by means of a conducting member which is disposed within a channel defined in the insulating separation layer. The first electrode is preferably an upper electrode, namely the electrode furthest from the substrate, and is a radiation receiving surface. In such a case, the lower electrodes of the photosensitive elements, namely those closest to the substrate, thereby act as an electrostatic shield between the upper radiation receiving surface of the photosensitive element and the output of the device, thereby reducing the capacitive coupling between these components.

The insulating separation layer preferably has a low dielectric constant, so that the additional capacitive coupling introduced by the layer, which may contribute to the detector output capacitance, is also reduced to a minimum.

The switching elements may comprise switching diodes or transistors. In either case, the switching operation alters the control of the photosensitive element, so that one operative mode is provided in which the photosensitive element is isolated and generates charge resulting from light incident on the photosensitive element, and another operative mode is provided in which the photosensitive element is charged or discharged by the sensor circuitry.

The photosensitive elements may be arranged in a matrix of rows and columns of photosensitive elements.

In the case of transistor switching elements used in a matrix of photosensitive elements, the gate electrodes of the switching elements associated with a row of photosensitive elements are connected together to a respective row electrode, and one of the channel electrodes of the transistors associated with a column of photosensitive elements are connected together to a respective column electrode.

BRIED DESCRIPTION OF THE DRAWING

Embodiments of the present invention will now be described, by way of example, with reference to the accompanying drawings, in which.

DETAILED DESCRIPTION OF THE PREFERRED EMBODIMENTS

Figure 1:
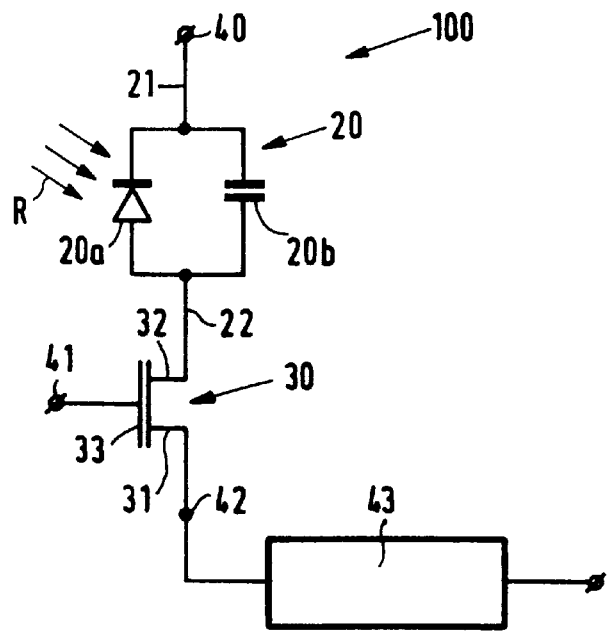
FIG. 1 is a simplified schematic circuit illustrating the operation of an image detector arrangement, in which arrangement the image detector of the invention may be incorporated.

It should be understood that the figures are merely schematic and are not drawn to scale. In particular, certain dimensions such as the thickness of layers or regions may have been exaggerated whilst other dimensions may have been reduced. It should also be understood that the same reference numerals are used throughout the figures to indicate the same or similar parts.

Figure 2:
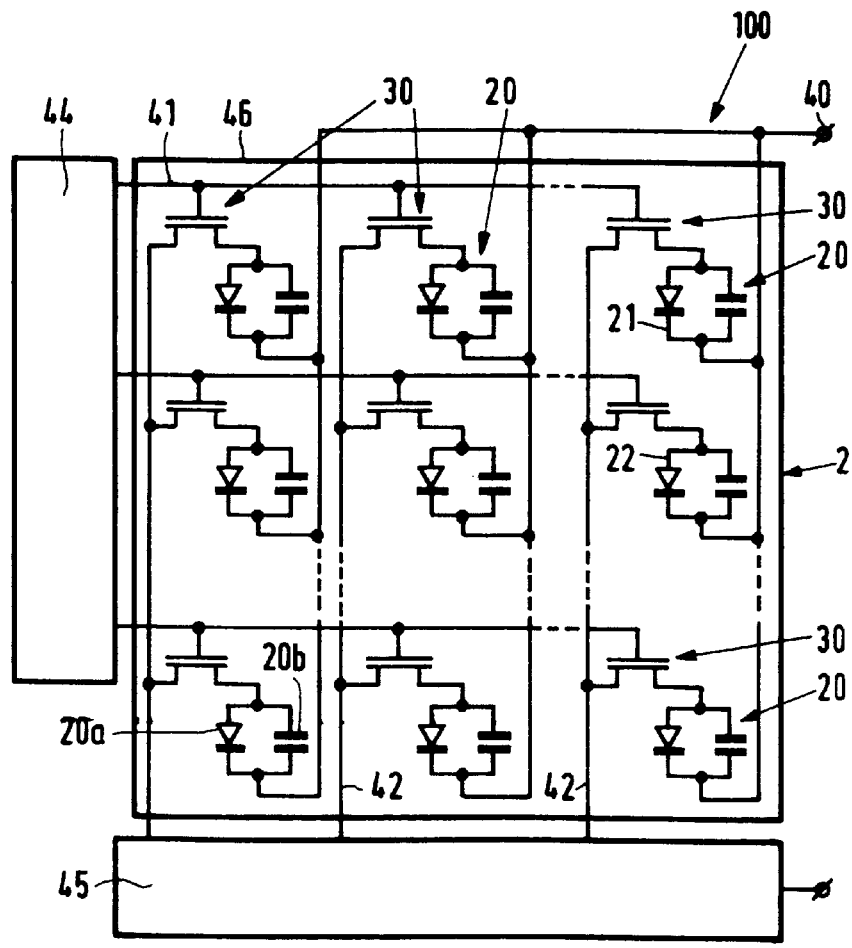
FIG. 2 is a simplified schematic circuit layout of an array of photosensitive elements and switching elements which may be constructed using image detectors according to the invention.
Figure 3:
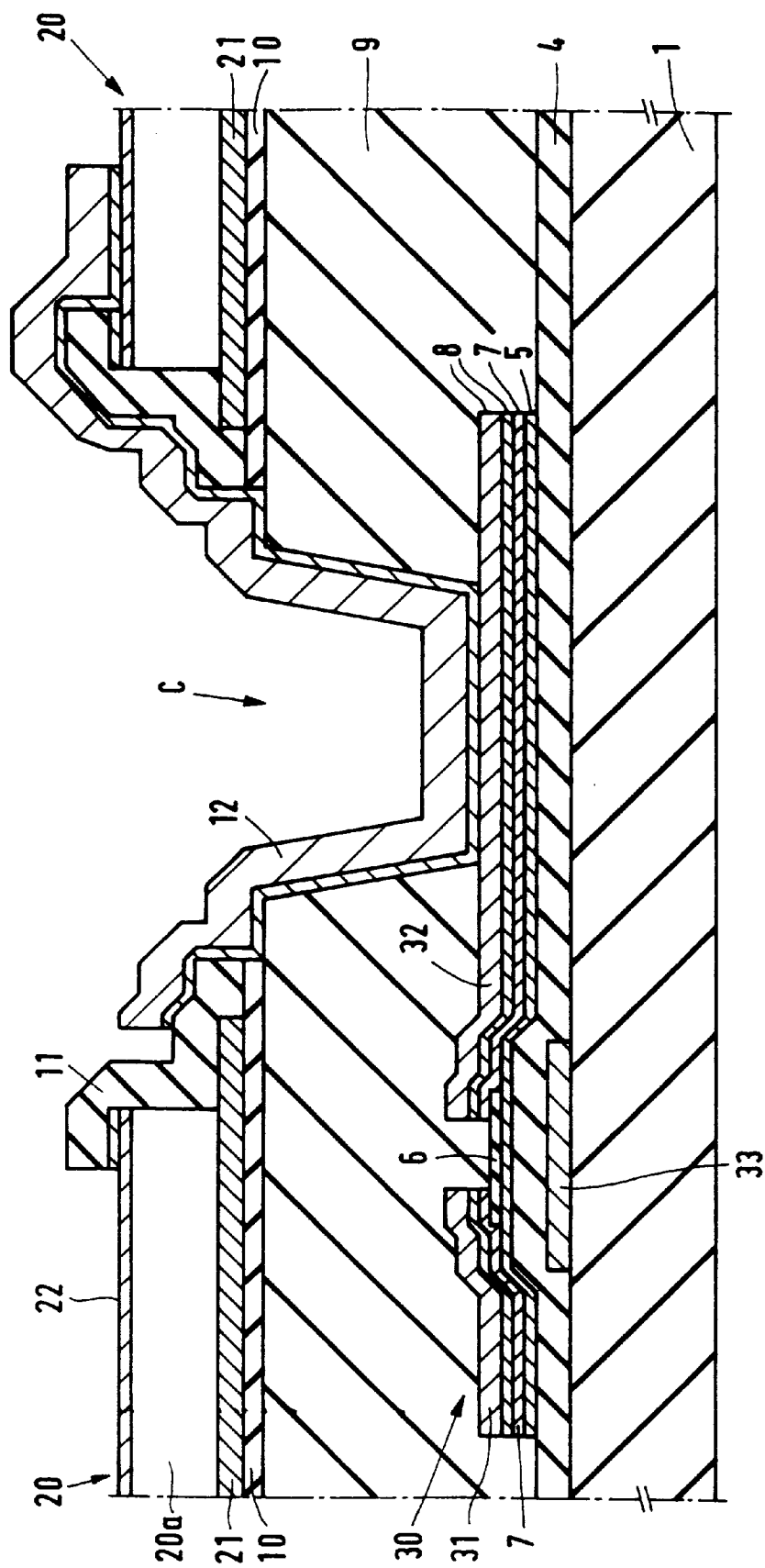
FIG. 3 shows a cross section of the image detector configuration according to the invention.

Referring now to the drawings, especially FIGS. 1 to 3 there is illustrated an image detector 100 comprising a substrate 1 carrying a series of layers of different materials patterned to define an array 2 of photosensitive elements 20 each having first 21 and second 22 opposed electrodes with the first electrode 21 being closer to the substrate 1 than the second electrode 22, and a plurality of switching elements 30, each switching element having first 31 and second 32 main electrodes and a control 33 electrode. The second main electrode 32 of each switching element 30 is connected to the second electrode 22 of an associated one of the photosensitive elements 20, and the first electrodes 21 of the photosensitive elements 20 are connected a common line 40.

The switching elements shown in the drawings are transistors, particularly thin film transistors, having two main electrodes and a control electrode. However, those skilled in the art will appreciate that the present invention may equally be applied to alternative arrangements in which the switching elements comprise switching diodes, such as thin film diodes, pin diodes or diode combinations. However, the use of transistors is preferred since the cross talk between photosenstive elements may be kept to a minimum, which is desirable for high accuracy applications, for example in medical X-ray imaging.

The invention concerns an arrangement in which the switching elements 30 are disposed on the substrate 1, and an insulating separation layer 9 substantially covers the switching elements 30. This separation layer enables the photosensitive elements to be disposed over the switching devices, so that a maximum area of the image sensor is responsive to the incident electromagnetic radiation, thus maximising the efficiency of the device. This is particularly important for X-ray imaging applications where a high resolution is required, but the invention is equally applicable to other applications. Since the separation layer extends between the input of the device, namely the photosensitive elements, and the output of the device, namely the switching devices, it should have a low dielectric constant so as to reduce the undesirable capacitive coupling between the input and the output of the device. Polymer insulators are particularly suitable for this purpose, and the use of polyimide is prefered, as it may also easily be deposited to form relatively thick and even layers using known techniques.

The invention is based on the realisation that polymer molecules of the insulating separation layer may penetrate into the diode structure, which results in the creation of impurity energy states, namely mid-gap states, within the light responsive structure of the photodiode. For example, in the case of an nip photodiode structure, additional energy levels may be introduced into the intrinsic semiconductor layer, with the result that thermal generation currents lead to an increase in the dark current. As the density of mid-gap states increases, the dark current increases and this dark current also degrades over time.

The structure according to the invention has an insulating barrier layer 10 formed over the insulating separation layer 9, and the barrier layer prevents the above described contamination of the photosensitive elements 20 from the insulating layer 9. The insulating barrier layer should have a dense molecular structure so as to provide a barrier to the poloymer molecules of the insulating separation layer which have been found to penetrate into the structure of the photodiode. Silicon nitride is a preferred insulating barrier layer.

Turning now specifically to the drawings, FIG. 1 illustrates the basic operational principle of an image detector in accordance with the invention.

As shown in FIG. 1, electromagnetic radiation R is incident upon an image detector 100 comprising an array 2 of photosensitive elements 20. In this example, the photosensitive elements comprise photosensitive diodes, which are responsive to the electromagnetic radiation R, which may comprise visible light. The array 2 is illustrated schematically in FIG. 1 by a single photosensitive element 20 which is shown as a diode 20a in parallel with a capacitor 20b which in this case represents the parasitic or self-capacitance of the diode 20a, but which may also include an additional capacitor to improve the dynamic range of the detector. The first electrode 21 of the photosensitive diode 20, represented by the cathode of diode 20a is connected to the common line 40 as will be described below, while the second electrode 22 of the photosensitive diode, represented by the anode of the diode 20a, is connected to the second electrode 32 of the associated switching element 30, in this example to the drain electrode of a thin-film transistor 30. The control or gate electrode 33 of the thin-film transistor 30 is connected to a row conductor 41 while the first or source electrode 31 of the thin-film transistor 30 is connected via a column conductor 42 to a charge sensitive readout amplifier 43 of a conventional type. A readout arrangement of the type described in EP-A-40282 could also be used.

FIG. 2 illustrates schematically the circuit layout of an area of the photodetector array 2. In this example, the array 2 comprises a two dimensional array of photodiodes 20 with a pitch of typically 200 $\mu$m (micrometres) or less and an overall size of up to 400 mm by 400 mm to achieve the sort of resolution required where the image detector is to be used for detecting diagnostic X-ray images of areas of a human or animal body. Typically, the array may be a 2000×2000 array of pixels. For convenience, only a portion of the array is shown in full in FIG. 2.

The thin-film transistor switching elements 30 are arranged in a matrix of 1-m rows and 1-n columns (only three rows and three columns are shown) with the gate of each transistor in a given row being connected to the same row conductor 41 of a row driver or decoder/addressing circuit 44 and the source of each transistor in a given column being connected to the same column conductor 42 of a column decoder/addressing circuit 45 including read out amplifiers 43 as shown in FIG. 1. The solid line 46 in FIG. 2 indicates the extent of the electromagnetic radiation detecting area of the photodetector array 2.

The first electrodes 21 of the photodiodes 20 are connected together to provide the common electrode 40 which, in operation of the image detector, is connected to a fixed reference potential, which keeps the photodiodes 20 reverse biassed. In the case of an n-i-p diode (that is with the n layer adjacent the first electrode and nearest to the substrate) the reference potential may be, for example, +3 volts.

A detailed description will now be given of the construction of the image detector, with particular reference to FIG. 3.

The substrate 1 is an insulating substrate, generally a glass substrate. A first metallisation layer is provided on the substrate and is patterned to define the control or gate electrodes 33 of the transistors 30. This metallisation layer may be provided by depositing a chrome layer.

An insulating layer 4, generally a silicon dioxide or silicon nitride layer, is then deposited followed by an intrinsic semiconductor layer 5, which will form the intrinsic conduction channel regions of the transistors 30, and optionally an etch stop layer 6. The etch stop layer 6 is an insulating layer, generally a silicon nitride layer and is patterned using a mask and conventional photolithographic and etching techniques to leave an area over a central region of each transistor 30 so as to act as an etch stop. A doped, generally an n conductivity type, semiconductor layer 7 is then deposited followed by a second metallisation level or layer 8. The layers 7 and 8 are patterned to define the transistor terminals 31, 32. The doped semicinductor layer 7 forms source and drain contact regions, but these do not necessarily need to be produced, and the layer 7 can in fact be omitted, with the metallisation layer or layers 8 deposited directly onto the channel of the transistor, formed by the intrinsic semiconductor layer 5.

The doped semiconductor layer 7 may be formed of the same material as the intrinsic semiconductor layer 5, for example amorphous or polycrystalline silicon. The second metallisation layer 8 may be a chrome layer and may, furthermore, include a patterned aluminium layer shown in FIG. 3, so as to increase the conductivity of the layer 8.

A thin film transistor is formed in this way, although other transistor configurations may also be employed. Furthermore, the swtiching devices may comprise diodes which are switched by applying suitable voltage levels to the row and column conductors, instead of providing gate control signals.

A thick insulating layer 9 is deposited over the transistor. This insulator layer typically has a thickness of greater than 5 μm and a low dielectric constant. A suitable layer is a polyimide with a dielectric constant of 2.9.

As described above, an advantage of a thick polyimide layer, having a low dielectric constant, is that the additional capacitance introduced between the pixel electrode 22 (the top of the photosensitive element) and the read-out electrode 31 (the source of the thin film transistor) is kept to a minimum. The polyimide layer may be deposited to a sufficent thickness with an upper surface which is sufficiently even, using known techniques. The insulating layer permits the photosensitive elements 20 to overlap the switching elements 30, enabling the photosensitive area of the device to be as large as possible.

The additional insulating barrier layer 10 of the invention is deposited over the insulating layer 9, and has a dense molecular configuration so as to act as an ion barrier layer. The barrier layer is preferably a layer of silicon nitride which is deposited by a plasma CVD (chemical vapour deposition) process and is shaped using a plasma etching step. Such a procedure for producing a silicon nitride layer is known to those skilled in the art. Other barrier layers may be contemplated, such as metal oxide layers which would be deposited by a sputtering process. This barrier layer prevents contamination of the photosensitive elements from the polyimide layer, which has been found by the applicant to degrade the performance of the photosensitive elements over time.

A metal layer 21, which may for example be a chrome layer, is deposited over the barrier layer 10, and this layer defines the common electrode of the photosensitive elements. The photosensitive elements comprise amorphous silicon diodes and are constructed using known techniques. In the example shown, the diodes comprise an n-i-p diode structure 20a (that is with the n conductivity type layer adjacent the first electrode 21) on top of the first electrode 21. The second electrode 22 is formed of a transparent conductor, for example an ITO layer.

A hole is etched into the first electrode layer 21 which substantially corresponds to an opening etched into the barrier layer 10. An insulating layer 11 is then deposited to passivate the photosensitive element 20 and the exposed ends of the common electrode 21. A hole is subsequently etched into the insulating layer 9 to form a channel C in the insulating layer 9 which enables the required connection of the drain 32 of the transistor with the upper electrode 22 of the associated photosensitive element 20. The channel C has a chamfered profile and is defined beneath the hole of the first electrode layer 21 and the opening in the barrier layer 10. This profile can be produced by plasma-etching. Finally, metallisation is used to make the common connection 12 between the top contact 22 of the photodiode 20 and the drain electrode 32 of the transistor 30. This metallisation layer may also comprise a chrome layer with an aluminium coating to improve the conductivity.

The electromagnetic radiation may be supplied directly to the photosensitive element 20 or may be converted electromagnetic radiation output from an energy conversion layer.

Thus, electromagnetic radiation with a first range of wavelengths may be incident on an energy conversion layer (not shown) of the image detector 100 which converts the incident electromagnetic radiation into the radiation R of different wavelength. The incident electromagnetic radiation may comprise X-radiation and the outgoing electromagnetic radiation R comprises visible light. In such a case, the energy conversion layer may be a phosphor layer, for example a layer of thallium-doped caesium iodide. Although other phosphors could be used, the use of thallium-doped caesium iodide has advantages in that the spectrum of the emitted electromagnetic radiation R peaks in the range of 400 to 700 nm (nanometres) which is the most responsive range of amorphous silicon photodiodes. In addition, caesium iodide has a columnar structure which provides a sort of light-guiding effect, so reducing scattering problems.

The energy conversion layer may be provided directly onto the array 2. Where the energy conversion layer is electrically conductive or semiconductive, for example where a thallium-doped caesium iodide phosphor layer is used, a protective insulating layer (not shown) transparent to the converted electromagnetic radiation R is first provided over the array 2. The insulating layer should be sufficiently thick, typically greater than 3 μm (micrometres), to reduce capacitive coupling between the energy conversion layer and the array. As an alternative, the energy conversion layer may be provided on a separate substrate, for example an aluminium substrate, which is then mounted to the array in the manner described in our copending application (our reference PHB 33729).

Figure 4:
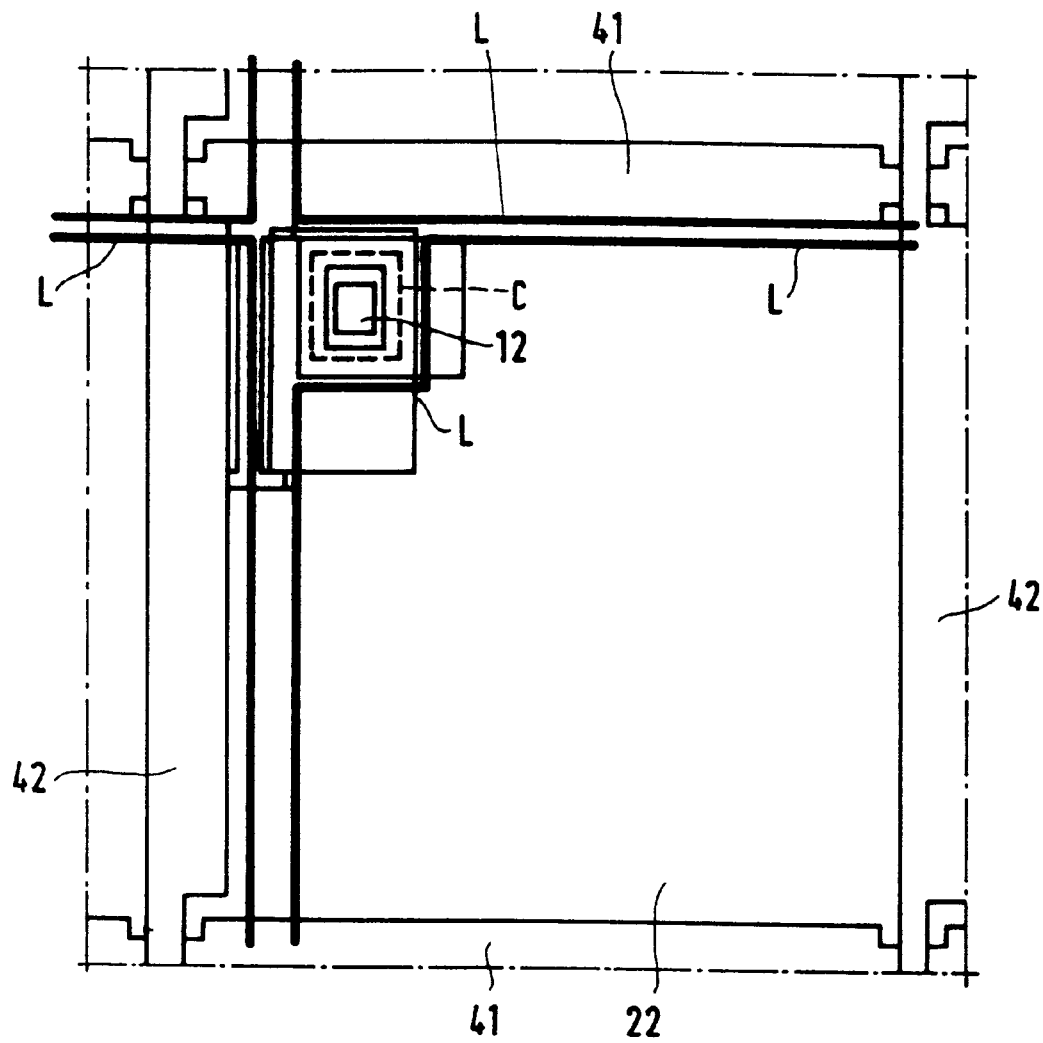
FIG. 4 shows a schematic plan view of an image detector according to the invention.

FIG. 4 shows a simplified schematic plan view of an image detector according to the invention, in which the pixels have a 200 μm pitch. A plan view of a single pixel is shown, within a two dimensional array of pixels. A 5 μm gap is defined between neighbouring diodes and the channel C also represents an area of the sensor which is not light responsive. The remainder of the area of the device is covered by the light sensitive area of the diodes, and the bold lines L indicate the boundary of the light sensitive areas of the image sensor, which give rise to an active area of 92%.

An advantage of the structure according to the invention is that there is negligible capacitive coupling between the pixel electrode 22 and the read-out electrode 31 (the source of the transistor). The common electrode 21 acts as an electrostatic shield in addition to the ion barrier 10. The use of a low dielectric constant thick insulating layer also reduces the additional capacitance introduced by that layer. As an example, the pixel read out capacitance is of the order of 90 fF, of which approximately 70 fF is derived from the thin film transistor characteristics and source-gate cross over.

Furthermore, the thin film transistor array is fully testable by electrical probe before the polyimide insulator layer is deposited and therefore before the photodiode arrangement is fabricated.

Figure 5:
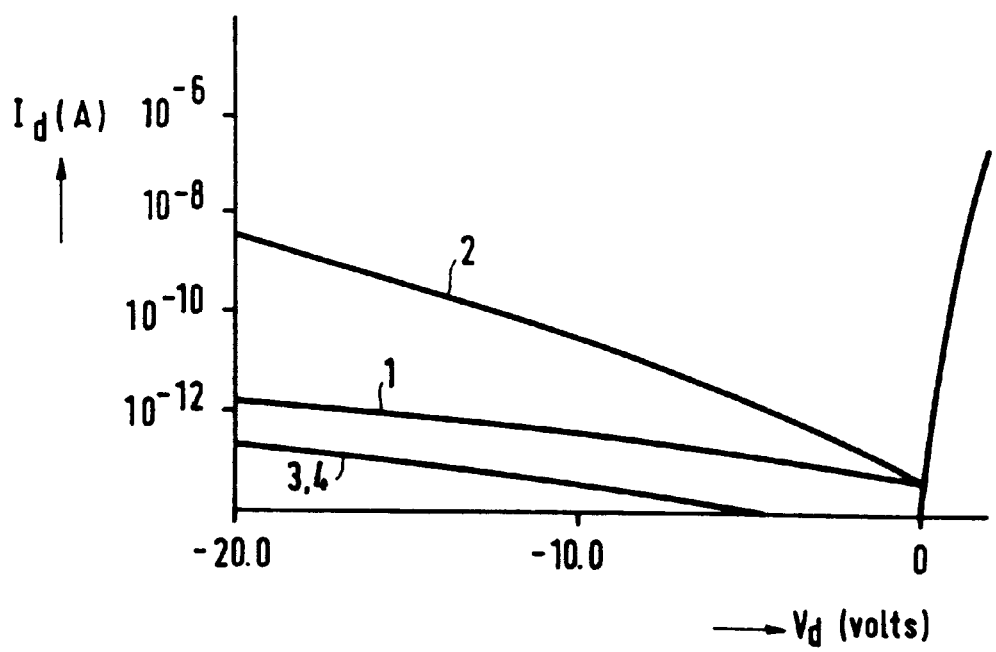
FIGS. 5 and 6 are graphs illustrating the improved dark current and reduced dark current degradation of a photosensitive element in an image detector according to the invention.
Figure 6:
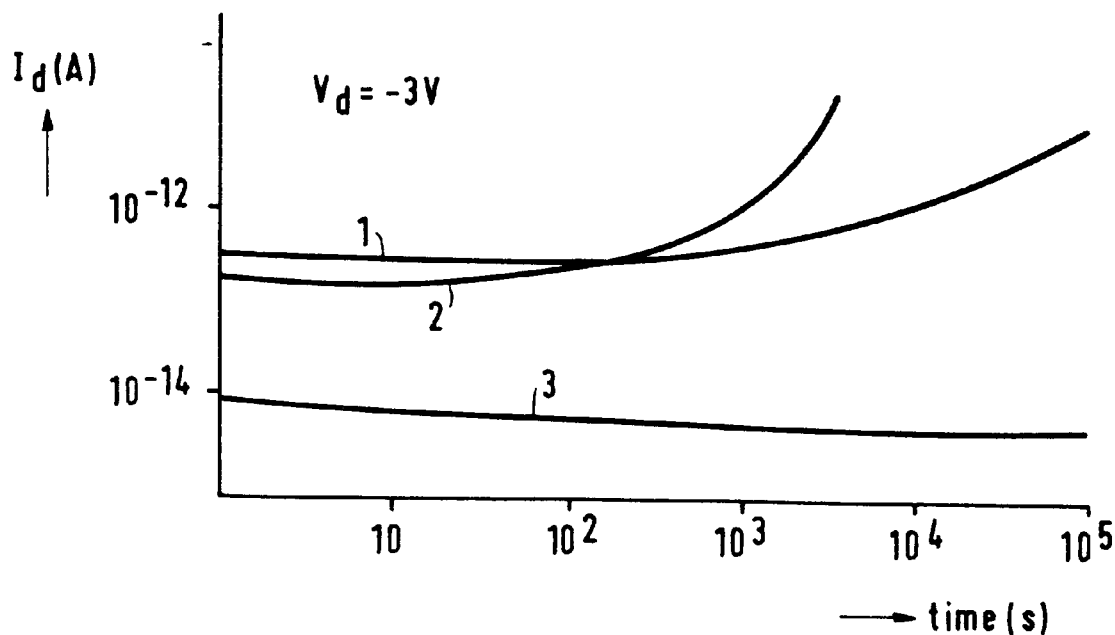

FIGS. 5 and 6 illustrate the advantages of the arrangement of the invention, and each compare, under different conditions, the dark current $I_d$ of the photodiode of an image sensor pixel according to the invention with the dark current of the photodiode of an identical pixel arrangement without the provision of the insulating barrier layer (hereinafter termed the "comparative pixel").

FIG. 5 shows the current-voltage characteristics for a non-illuminated diode. Curve 1 represents the initial dark current for the comparative pixel, for different levels of reverse bias of the photodiode. The dark current increases for increased reverse bias, but remains at a relatively low value. However, after 70 days without use of the image sensor, the dark current degrades, as represented in curve 2 of FIG. 5. Furthermore, the dependence of the dark current upon the reverse bias of the photodiode becomes more pronounced, and the level of the dark current may become unacceptable particularly where a high reverse bias may be desired.

Curve 3 represents the initial dark current for the pixel of the invention, and the significant reduction in the dark current can be observed for all levels of reverse bias of the photodiode. After 70 days without use, the current voltage characteristics remain unaltered, represented by curve 4. Thus, for a reverse bias of 20 Volts, the reduction in the dark current after the image sensor has been "on the shelf" for 70 days, is a factor of approximately $10^4$.

This prevention of degradation of the photodiode characteristics over time is illustrated in FIG. 6, which considers three image sensor pixels each with a continuous reverse bias of 3 Volts applied to the photodiode. Curves 1 and 2 represent two different comparative pixels (two samples of pixel having the arrangement of the invention with the omission of the barrier layer). In each sample, there is an acceleration of the degradation of the dark current over time. Curve 3 represents the time dependence of the dark current of a photodiode in the pixel arrangement of the invention. There is no appreciable degradation in the level of the photodiode dark current over time.

From reading the present disclosure, other modifications and variations will be apparent to persons skilled in the art. Such modifications and variations may involve other features which are already known in the art and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

All references cited herein are incorporated herein by reference in their entirety and for all purposes to the same extent as if each individual publication or patent or patent application was specifically and individually indicated to be incorporated by reference in its entirety for all purposes.

We claim:

1. An image detector comprising a substrate carrying a plurality of switching elements, an insulating separation layer disposed over the substrate and substantially covering the switching elements, a photosensitive element being associated with each switching element, each photosensitive element comprising first and second electrodes, the first electrode of each photosensitive element being coupled to a first electrode of the associated switching element, the insulating separation layer being capable of contaminating the photosensitive elements, and an insulating barrier layer disposed over the insulating separation layer, the photosensitive elements being disposed over the insulating barrier layer, and the insulating barrier layer serving to prevent the insulating separation layer from contaminating the photosensitive elements.

2. An image detector as claimed in claim 1, wherein the photosensitive elements are arranged in a matrix of rows and columns of photosensitive elements.

3. An image detector as claimed in claim 1, wherein the switching elements comprise diodes.

4. The detector of claim 1 wherein the insulating barrier layer comprises silicon nitride, and wherein the insulating separation layer comprises polyimide.

5. The detector of claim 1 wherein the insulating separation layer comprises polymer.

6. The detector of claim 1 wherein the insulating separation layer comprises polymer, and wherein the insulating barrier layer has a molecular structure that provides a barrier to the molecules of the insulating separation layer.

7. An image detector as claimed in claim 1, wherein the first electrode of the photosensitive element is coupled to the first electrode of the associated switching element by means of a conducting member which is disposed within a channel defined in the insulating separation layer.

8. An image detector as claimed in claim 1, wherein the switching elements comprise thin film transistors.

9. An image detector as claimed in claim 8, in which each thin film transistor comprises first and second channel electrodes and a gate electrode, wherein the first channel electrode comprising the first electrode of the switching element which is coupled to the first electrode of the respective photosensitive element, the second electrode of each photosensitive element is connected to a common terminal, the second channel electrodes of the switching elements associated with a column of photosensitive elements are connected together to a respective column electrode, and the gate electrodes of the switching elements associated with a row of photosensitive elements are connected together to a respective row electrode.

10. An image detector as claimed in claim 1, wherein an energy conversion layer is provided for converting electromagnetic radiation with a first range of wavelengths into electromagnetic radiation with a second range of wavelengths detectable by the photosensitive elements.

11. An image detector as claimed in claim 10, wherein the energy conversion layer comprises a phosphor layer.

12. An image detector as claimed in claim 1, wherein the insulating barrier layer comprises a layer of silicon nitride.

13. An image detector as claimed in claim 12, where in the first electrode of the photosensitive element is coupled to the first electrode of the associated switching element by means of a conducting member which is disposed within a channel defined in the insulating separation layer.

14. An image detector as claimed in claim 12, wherein the photosensitive elements are arranged in a matrix of rows and columns of photosensitive elements.

15. An image detector as claimed in claim 13, wherein the switching elements comprise thin film transistors.

16. An image detector as claimed in claim 1, wherein the insulating separation layer comprises a layer of polyimide.

17. An image detector as claimed in claim 16, wherein the first electrode of the photosensitive element is coupled to the first electrode of the associated switching element by means of a conducting member which is disposed within a channel defined in the insulating separation layer.

18. An image detector as claimed in claim 16, wherein the photosensitive elements are arranged in a matrix of rows and columns of photosensitive elements.

19. An image detector as claimed in claim 16, wherein the switching elements comprise thin film transistors.

* * * * *